(12) United States Patent
Chao et al.

(10) Patent No.: US 7,957,923 B2
(45) Date of Patent: Jun. 7, 2011

(54) DEVICE FOR JITTER MEASUREMENT AND METHOD THEREOF

(75) Inventors: An-Sheng Chao, Tainan (TW);
Soon-Jyh Chang, Tainan (TW);
Chih-Haur Huang, Tainan County (TW); Kuo-Chan Huang, Tainan County (TW); Shih-Ming Luo, Tainan (TW)

(73) Assignees: Himax Technologies Limited, Tainan County (TW); NCKU Research & Development Foundation, Tainan (TW)

( * ) Notice: Subject to any disclaimer, the term of this patent is extended or adjusted under 35 U.S.C. 154(b) by 513 days.

(21) Appl. No.: 12/117,176

(22) Filed: May 8, 2008

(65) Prior Publication Data
US 2009/0112499 A1 Apr. 30, 2009

Related U.S. Application Data

(60) Provisional application No. 60/949,879, filed on Jul. 16, 2007.

(51) Int. Cl.
*G06F 19/00* (2006.01)
*H04B 3/46* (2006.01)
(52) U.S. Cl. .......................... 702/69; 375/226
(58) Field of Classification Search ............... 702/69; 375/226; 324/76.77
See application file for complete search history.

(56) References Cited

U.S. PATENT DOCUMENTS

| 6,687,629 | B1 * | 2/2004 | Yamaguchi et al. | 702/69 |
| 7,496,137 | B2 * | 2/2009 | Ichiyama et al. | 375/226 |
| 2004/0062301 | A1 * | 4/2004 | Yamaguchi et al. | 375/226 |
| 2007/0118314 | A1 * | 5/2007 | Ichiyama et al. | 702/69 |

OTHER PUBLICATIONS

Authored by Chan, at al., article titled "A jitter characterization system using a component-invariant vernier delay line", adopted from Ieee transactions on very large scale integration (VLSI) systems, vol. 12, No. 1, Jan. 2004, p. 79-95.

* cited by examiner

*Primary Examiner* — Bryan Bui
(74) *Attorney, Agent, or Firm* — J.C. Patents

(57) ABSTRACT

The device for jitter measurement and a method thereof are provided. The device for jitter measure includes a signal retrieving module, a signal amplifying module, an edge detecting module, and a time-to-digital converting module. The signal retrieving module receives a signal-under-test, and retrieves a first pulse signal having a pulse width equal to a period of the signal-under-test. The signal amplifying module amplifies the pulse width of the first pulse signal and thereby generates a second pulse signal. The edge detecting module detects a rising edge and a falling edge of the second pulse signal, and generates a first indication signal and a second indication signal according to the respective detected results. The time-to-digital converting module converts the pulse width of the second pulse signal existed in time domain to a digital signal according to the first indication signal and the second indication signal.

21 Claims, 9 Drawing Sheets

DEVICE FOR JITTER MEASUREMENT AND METHOD THEREOF

CROSS-REFERENCE TO RELATED APPLICATION

This application claims the priority benefit of U.S.A. provisional application Ser. No. 60/949,879, filed on Jul. 16, 2007. The entirety of the above-mentioned patent application is hereby incorporated by reference herein and made a part of specification.

BACKGROUND OF THE INVENTION

1. Field of the Invention

The present invention relates to a device for jitter measurement and method thereof, and more particularly, to a device and a method that utilize the delay lines to implement the jitter measurement.

2. Description of Related Art

Jitter is a time shifting interval of a signal between a real transition location and an ideal transition location. As for a data transmission system, jitter would cause the incorrect operation of data transmission, and reduce the system reliability even cause error operation of the system. Jitter analysis has become more important in recent years due to high speed data calculation and signal transmission.

In traditional chip testing technology, the off-chip jitter measurement method utilizes an oscilloscope or a spectrum analyzer to measure the output signal of a chip for observing if the transition edges of the output signal fit in with expectation. However, the input and output (I/O) pads and bonding wirings often distort the output signal of the chip and reduce the accuracy of measuring results. The need of pin count often increases with the increase of transistor number in the chip. Nevertheless, the number of pins has not increased nearly as fast as the number of transistors due to mechanical limitation of the packaging technology. As a result, the pins that can be provided for testing are limited, and not all the signals-under-test (SUTs) can be accessed through independent pins. In digital signal processing, the pin count can be decreased by utilizing the serial transmission to transmit the signals-under-test. Nevertheless, the serial transmission can not be applied to the analog signal. The limit of pin counts and the unpredictable characteristic in transmitting the on-chip signal-under-test increase the testing difficulties of mix-signal chips. Therefore, a built-in self testing technology for jitter measurement is provided to overcome the above-mentioned problems.

The most important issue of the jitter measurement method by built-in self testing is to convert the continuous-time signal to a digital representation for the convenience of reading out and further processing. In the article with the title "A jitter characterization system using a component-invariant vernier delay line," *IEEE Trans. on Very Large Scale Integration System*, pp. 79-95, 2004, a jitter measurement method utilizing component-invariant vernier delay line is provided. FIG. 1 is a circuit diagram of the conventional jitter measurement architecture according to the said article. Referring to FIG. 1, the jitter measurement device 100 includes the edge detectors 110 and 120, the ring oscillators 130 and 140, a phase detector 150 and a counter 160. The edge detectors 110 and 120 respectively convert a signal Data (referred as a signal-under-test) and a reference clock signal Clock to the step signals S1 and S2. The ring oscillators 130 and 140 respectively receive the step signals S1 and S2, and thereby generate the periodic pulse signals P1 and P2. The counter 160 records the oscillation times of the ring oscillators 130 and 140, and stops counting when the phase detector 150 detects the signal Data lagged the reference clock signal Clock.

The delay units 131 and 141 are respectively included in the ring oscillators 130 and 140, and designed to have different delay time $\tau s$ and $\tau f$. It is supposed that the delay time $\tau s$ is greater than the delay time $\tau f$ by T1 seconds. The signal Data leads the reference clock signal Clock by T2 seconds, wherein T2>0, and the step signal S1 leads the step signal S2 by T2 seconds after edge detectors 110 and 120 are triggered. The delay time difference between the delay units 131 and 141 can be seen as a smallest resolution for measuring jitter. When the ring oscillators 130 and 140 accomplish one oscillation in the first time, a phase difference equaling (T2−T1) is existed between the pulse signals P1 and P2. To reason by analogy, when the ring oscillators 130 and 140 oscillate K times, the phase difference is (T2−K×T1). The counter 160 stops at the value K when the phase detector 150 detects the signal Data lagged the reference clock signal Clock, that is, (T2−K×T1)<0. Therefore, the edge detectors 110 and 120, the ring oscillators 130 and 140, the phase detector 150 and the counter 160 can be combined as a time-to-digital converter.

Although, the resolution which is less than the delay time of a logic gate for jitter measurement is achieved in the said article, the ring oscillators 130 and 140 may produce unwanted noises, and the delay time is not easy to control due to the affection of process variation and operation environment. Besides, an additional reference clock is necessary and more operation time is also necessary for obtaining enough sampling patterns in the said article. Those constraints should be taken into consideration to reduce the measuring difficulties.

SUMMARY OF THE INVENTION

Accordingly, the present invention provides a device for jitter measurement and a method thereof. The measuring device and method have several advantages, such as small resolution, multiple resolutions, and no needs of the reference signals. Furthermore, the measuring device for built-in self testing can save the chip area and alleviate load effect.

A device for jitter measurement is provided in the present invention. The device for jitter measurement includes a signal retrieving module, a signal amplifying module, an edge detecting module, and a time-to-digital converting module. The signal retrieving module receives a signal-under-test, and outputs a first pulse signal having a pulse width equal to a period of the signal-under-test. The signal amplifying module amplifies the pulse width of the first pulse signal for equivalently improving the resolution of the first pulse signal, and thereby generates a second pulse signal. The edge detecting module respectively detects a rising edge and a falling edge of the second pulse signal, and generates a first indication signal and a second indication signal. The time-to-digital converting module converts the pulse width of the second signal existed in time domain to a digital signal according to the first indication signal and the second indication signal.

A method for jitter measurement is provided in the present invention. A signal-under-test is received and a first pulse having a pulse width equal to a period of the signal-under-test is retrieved. Next, the pulse width of the first pulse signal is amplified to equivalently improve the resolution of the first pulse signal and thereby a second pulse signal is generated. Next, a rising edge and a falling edge of the second pulse signal are respectively detected, and thereby a first indication signal and a second indication signal are generated. Next, the pulse width of the second pulse signal existed in time domain is converted to a digital signal according to the first indication signal and the second indication signal for obtaining a jitter value of the signal-under-test.

The present invention provides a device for jitter measurement and a method thereof that amplifies the pulse width of the first pulse signal to equivalently improve the resolution for measuring the jitter value. Therefore, by adjusting different amplifying ratios, the jitter value of the signal-under-test can be quantified by multiple resolutions. The second pulse signal is obtained by amplifying the first pulse signal, and the first indication signal and the second indication signal are obtained by respectively detecting the rising edge and the falling edge of the second pulse signal. The pulse width of the second pulse signal existed in time domain can be converted to a digital signal by the time-to-digital converting module according to the first and the second indication signals so as to obtain the jitter value of the signal-under-test.

In order to make the features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
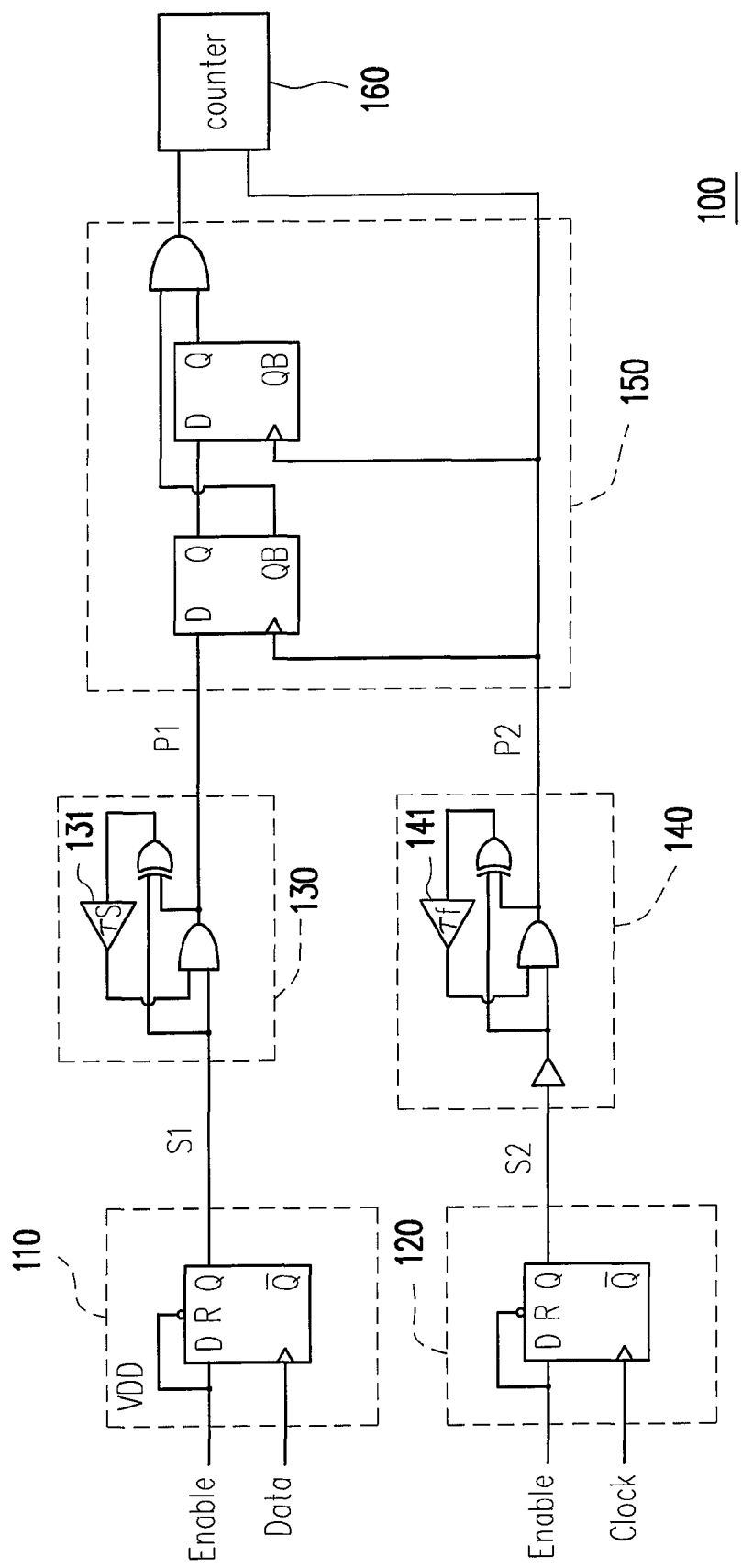
FIG. 1 is a circuit diagram of a conventional jitter measurement architecture.
Figure 2:
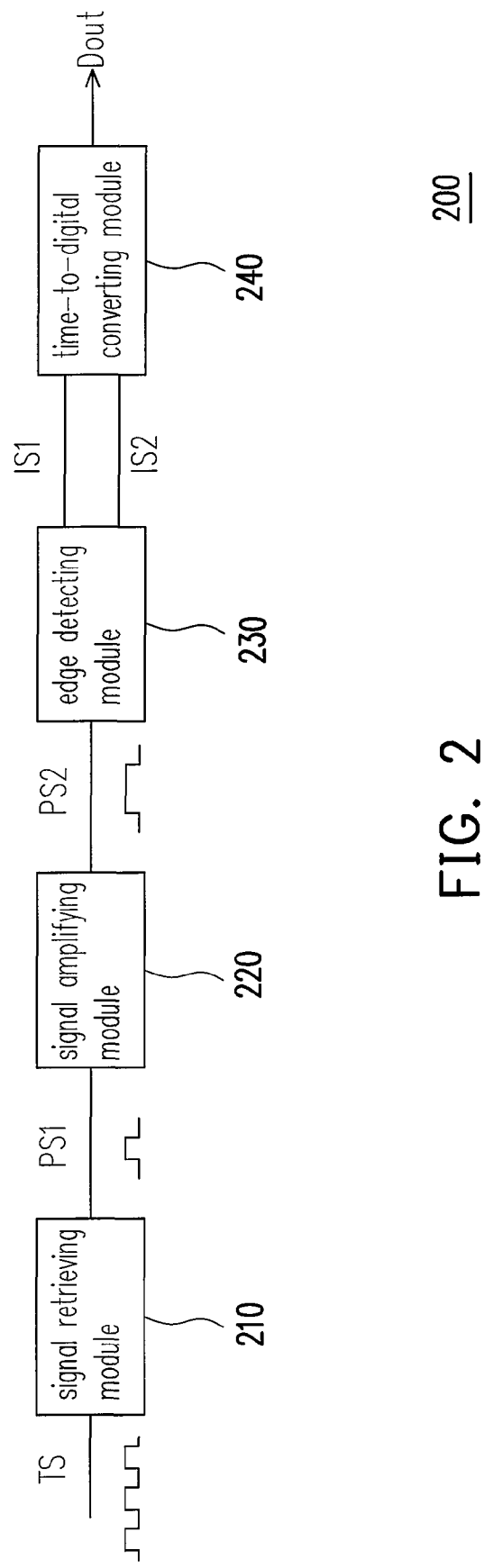
FIG. 2 is a block diagram of the device for jitter measurement according to an embodiment of the present invention.

FIG. 2 is a block diagram of a device for the jitter measurement according to an embodiment of the present invention.

Referring to FIG. 2, the device 200 for jitter measurement includes a signal retrieving module 210, a signal amplifying module 220, an edge detecting module 230 and a time-to-digital converting module 240. The signal retrieving module 210 receives a signal-under-test TS and retrieves a first pulse signal PS1 having a pulse width equal to a period of the signal-under-test TS. The signal amplifying module 220 amplifies the pulse width of the first pulse signal PS1 and thereby generates a second pulse signal PS2. Since the pulse width of the first pulse signal PS1 is one period length of the signal-under-test TS in time domain, amplifying the pulse width of the first pulse signal PS1 equivalently improves the resolution of the first pulse signal PS1. The edge detecting module 230 detects a rising edge and a falling edge of the second pulse signal PS2 and thereby generates a first indication signal IS1 and a second indication signal IS2, respectively. The time-to-digital converting module 240 converts the pulse width of the second pulse signal existed in time domain to a digital signal according to the first indication signal IS1 and the second indication signal IS2 so as to obtain a jitter value Dout of the signal-under-test TS. The following description is the detailed operation of each said function module.

Figure 3A:
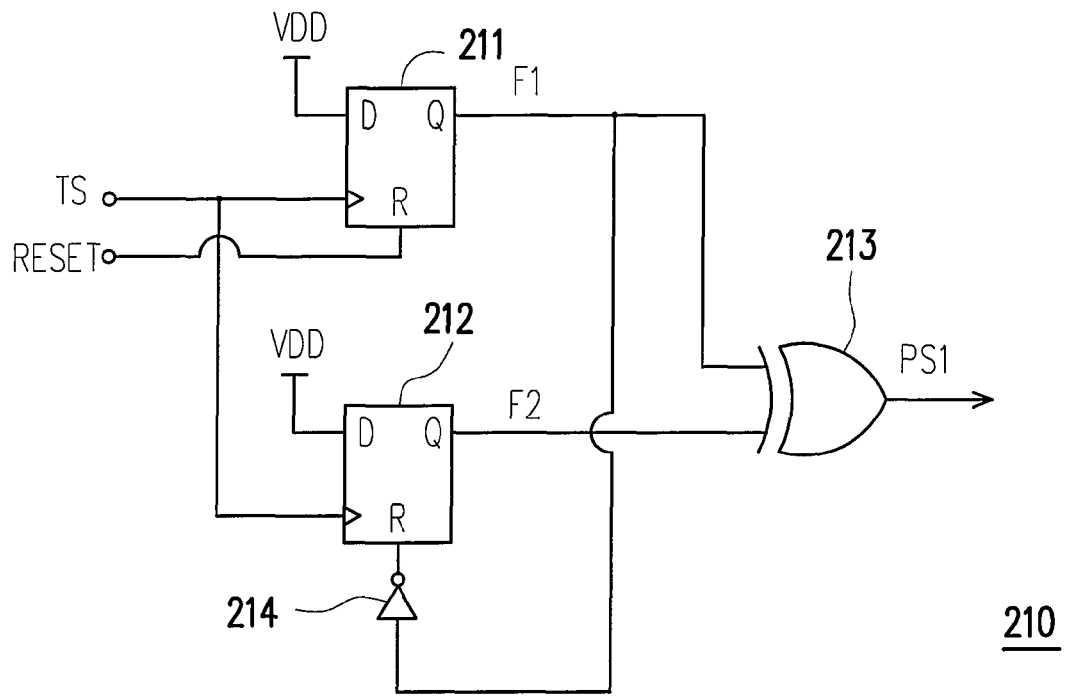
FIG. 3A is a circuit diagram of the signal retrieving module according to the embodiment of the present invention in FIG. 2.

FIG. 3A is a circuit diagram of the signal retrieving module 210 according to the embodiment of the present invention in FIG. 2. Referring to FIG. 3A, the signal retrieving module 210 includes the edge detectors 211 and 212, an XOR gate 213 and an inverter 214. The edge detector 211 has a data terminal coupled to a voltage VDD, a control terminal receiving the signal-under-test TS, a reset terminal receiving a reset signal RESET, and an output terminal generating a first signal F1. The edge detector 212 has a data terminal coupled to the voltage VDD, a control terminal receiving the signal-under-test TS, and an output terminal generating a second signal F2. The inverter 214 has an input terminal and an output terminal respectively coupled to the output terminal of the edge detector 211 and a reset terminal of the edge detector 212. The XOR gate 213 receives the first signal F1 and the second signal F2, and thereby generates the first pulse signal PS1.

Figure 3B:
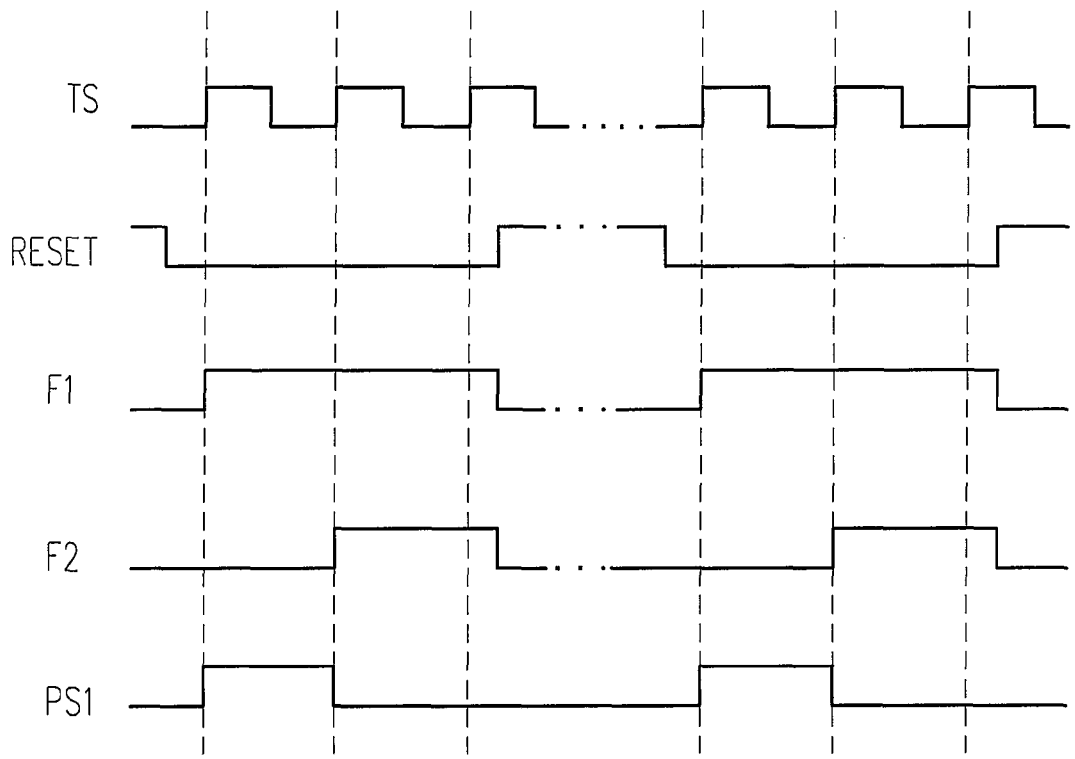
FIG. 3B is a timing diagram of the signal retrieving module according to the embodiment of the present invention in FIG. 3A.

FIG. 3B is a timing diagram of the signal retrieving module 210 according to the embodiment of the present invention in FIG. 3A. Referring to FIG. 3A and FIG. 3B, it is supposed that the edge detectors 211 and 212 are triggered with positive edges. The edge detectors 211 and 212 stay in the reset modes when the reset signal RESET is in logic high level ("1") and respectively generate the first signal F1 and the second signal F2 in logic low levels ("0"). When the reset signal RESET is in logic low level ("0"), the edge detector 211 detects a first rising edge of the signal-under-test TS and generates the first signal F1 in logic high level ("1"), that is, a voltage level of the data terminal of the edge detector 211. At present, an inverted first signal, which is in logic low level ("0"), is outputted from the inverter 214 to the reset terminal of the edge detector 212, and the inverted first signal activates the edge detector 212 to operate. The edge detector 212 detects a second rising edge of the signal-under-test TS and generates the second signal F2 in logic high level ("1"). The edge detectors 211 and 212 stay in normal modes until the reset signal RESET is in logic high level ("1") again. The XOR gate 213 performs a logic processing on the first signal F1 and the second signal F2, and thereby generates the first pulse signal PS1 which is equal to a period of the signal-under-test TS.

Figure 4:
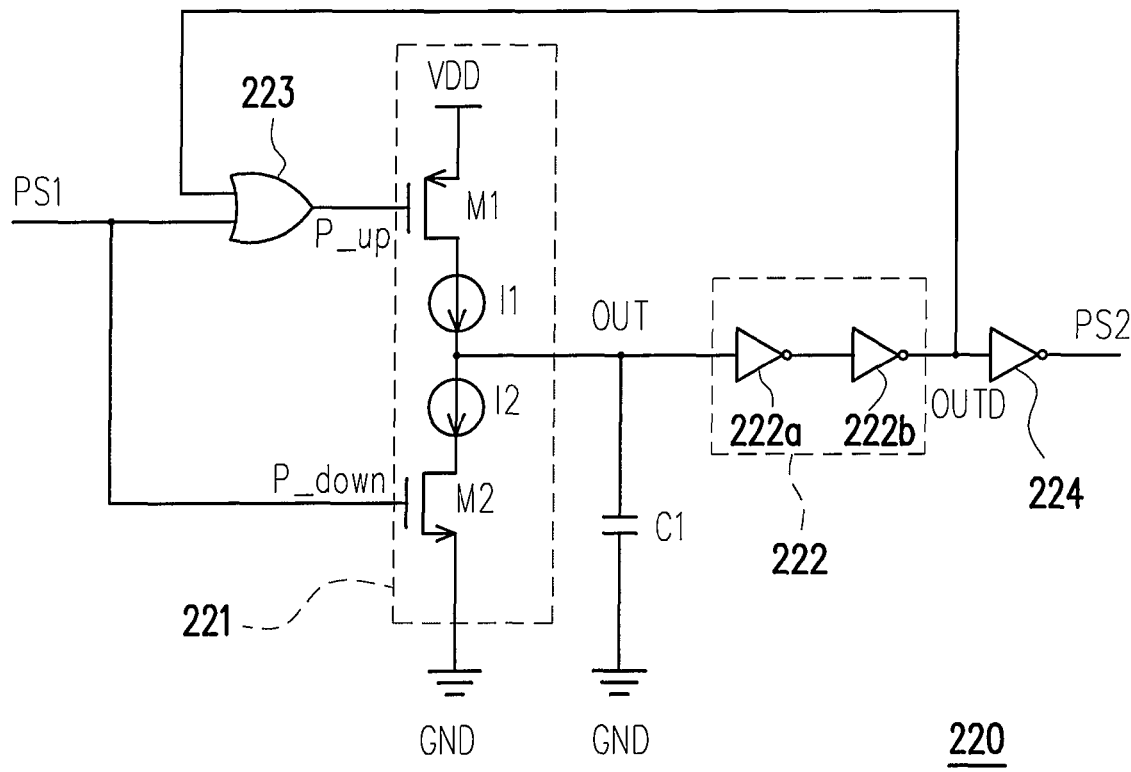
FIG. 4 is a circuit diagram of the signal amplifying module according to the embodiment of the present invention in FIG. 2.

FIG. 4 is a circuit diagram of the signal amplifying module 220 according to the embodiment of the present invention in FIG. 2. Referring to FIG. 4, the signal amplifying module 220 includes a capacitor C1, a charge pump 221, a buffer unit 222, an inverter 224, and an OR gate 223. The capacitor C1 has a first terminal used to generate the second pulse signal PS2 and a second terminal coupled to a ground voltage GND. The buffer unit 222 is composed of the inverters 222a and 222b in series connection. The buffer unit 222 is used for enhancing the transmission intensity of the first terminal signal OUT of the capacitor C1, wherein the signal OUT is related to the second pulse signal PS2. The inverter 224 has an input terminal coupled to the first terminal of the capacitor C1 through the buffer unit 222, and an output terminal outputting the second pulse signal PS2. The charge pump 221 is coupled between the signal retrieving module 210 and the first terminal of the capacitor C1 for charging or discharging the capacitor C1 according to the first pulse signal PS1, and amplifying the pulse width of the first pulse signal PS1 by adjusting the amounts of charging current and discharging current.

The charge pump 221 includes the switches M1 and M2, and the current sources I1 and I2. In the embodiment, it is supposed that the switch M1 is a P-type transistor and the switch M2 is an N-type transistor. The switch M1 has a control terminal receiving a pull-up signal P_up, a first terminal coupled to the voltage VDD, and a second terminal coupled to a first terminal of the first current source I1. The current source I1 has a second terminal coupled to the first terminal of the capacitor C1. The current source I2 has a first terminal coupled to the second terminal of the first current source I1, and a second terminal coupled to a first terminal of the switch M2. The switch M2 has a control terminal receiving a pull-down signal P_down, and a second terminal coupled to the ground voltage GND. The OR gate 223 performs a logic processing on the first pulse signal PS1 and an output signal OUTD of the buffer unit 222, and thereby generates the pull-up signal P_up. In the embodiment, the pull-down signal P_down is the first pulse signal PS1.

Referring to FIG. 4, initially, the output signal OUTD of the buffer unit 222 is either in logic high level ("1") or logic low level ("0") since the output signal OUTD is the output of the inverter 222b. By the assumption that the output signal OUTD of the buffer unit 222 is in logic low level ("0") and the first pulse signal PS1 is in logic low level ("0") initially, the switch M1 is conducted and then the first terminal signal OUT of the capacitor C1 is charged to the threshold voltage of the inverter 222a so that the output signal OUTD of the buffer unit 222 changes to be in logic high level ("1"). The result conflicts with the assumption. On the contrary, if the output signal OUTD of the buffer unit 222 is in logic high level ("1"), the pull-up signal P_up is in logic high level ("1") so that the switch M1 is not conducted. The first terminal signal OUT of the capacitor C1 can stay in its previous state. The assumption that the output signal OUTD of the buffer unit 222 is in logic high level ("1") is appropriate. Consequently, in the default mode of the signal amplifying module 220, the state of the output signal OUTD in logic high level ("1") and the first pulse signal PS1 in logic low level ("0") causes the switches M1 and M2 not conducted. Hence, the signal amplifying module 220 stays in the default mode until the rising edge of the first pulse signal PS1 occurs.

The switch M2 is conducted after the first pulse signal PS1 rises to logic high level ("1"). The capacitor C1 is discharged through the current source I2 and the conducted switch M2 until the first pulse signal falls to logic low level ("0"). Then, the output signal OUTD of the buffer unit 222 falls to logic low level ("0") to generate the rising edge of the second pulse signal PS2 via the inverter 224. After the first pulse signal PS1 falls to logic low level ("0"), the switch M1 controlled by the pull-up signal P_up is conducted and the switch M2 is not conducted. The capacitor C1 is charged to the threshold voltage of the inverter 222a through the switch M1 and the current source I1, and then the output signal OUTD of the buffer unit 222 is changed to logic high level ("1") to generate the falling edge of the second pulse signal PS2 via the inverter 224. The pulse width of the second pulse signal PS2 equals to the duration of discharging and charging process of the first terminal signal OUT of the capacitor C1. By adjusting the amounts of the charging current and the discharging current of the charge pump 221, the pulse width of the first pulse signal PS1 can be amplified. For example, if the ratio of the charging current to the discharging current is one to K, the ratio of the pulse width of the second pulse signal PS2 to the pulse width of the first pulse signal PS1 is (K+1) to one. Next, the second pulse signal PS2 is transmitted to the edge detecting module 230.

Figure 5:
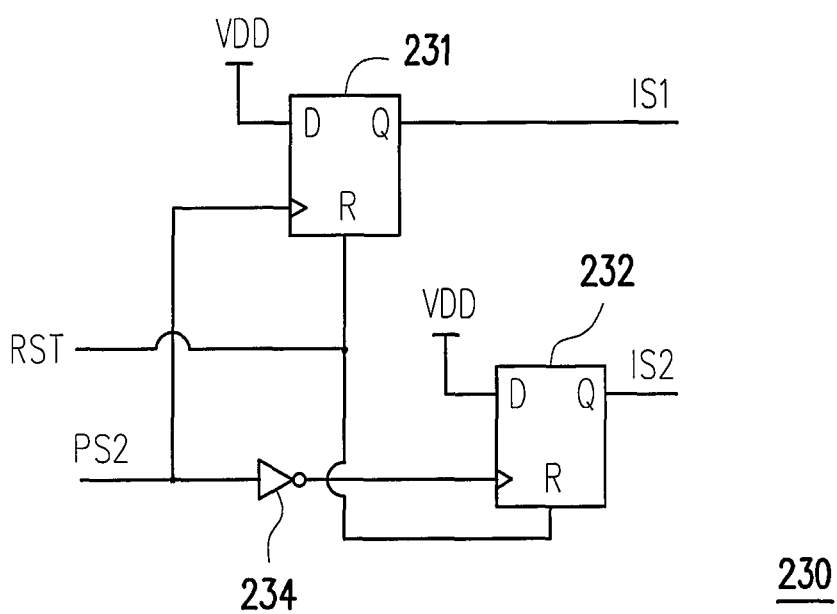
FIG. 5 is a circuit diagram of the edge detecting module according to the embodiment of the present invention in FIG. 2.

FIG. 5 is a circuit diagram of the edge detecting module 230 according to the embodiment of the present invention, in FIG. 2. Referring to FIG. 5, the edge detecting module 230 includes the edge detectors 231 and 232, and an inverter 234. The edge detector 231 has a data terminal coupled to the voltage VDD, a control terminal receiving the second pulse signal PS2, a reset terminal receiving a reset signal RST, and an output terminal generating the first indication signal IS1. In the embodiment, the reset signal RST can be same as the reset signal RESET in FIG. 3A. The edge detector 232 has a data terminal coupled to the voltage VDD, a control terminal receiving an inverted second pulse signal, a reset terminal receiving the reset signal RST, and an output terminal generating the second indication signal IS2. The inverter 234 has an input terminal receiving the second pulse signal PS2, and an output terminal generating an inverted second pulse signal. In the embodiment, the first indication signal IS1 and the second indication signal IS2 are initially reset to logic low level ("0") by the reset signal RST. In normal operations, the edge detector 231 is triggered by the rising edge of the second pulse signal PS2, and the edge detector 232 is triggered by the falling edge of the second pulse signal PS2. Therefore, when the rising edge of the second pulse signal PS2 is detected by the edge detector 231, the edge detector 231 changes the first indication signal IS1 to be in logic high level ("1"). When the falling edge of the second pulse signal PS2 is detected by the edge detector 232, the edge detector 232 changes the second indication signal IS2 to be in logic high level ("1").

Figure 6A:
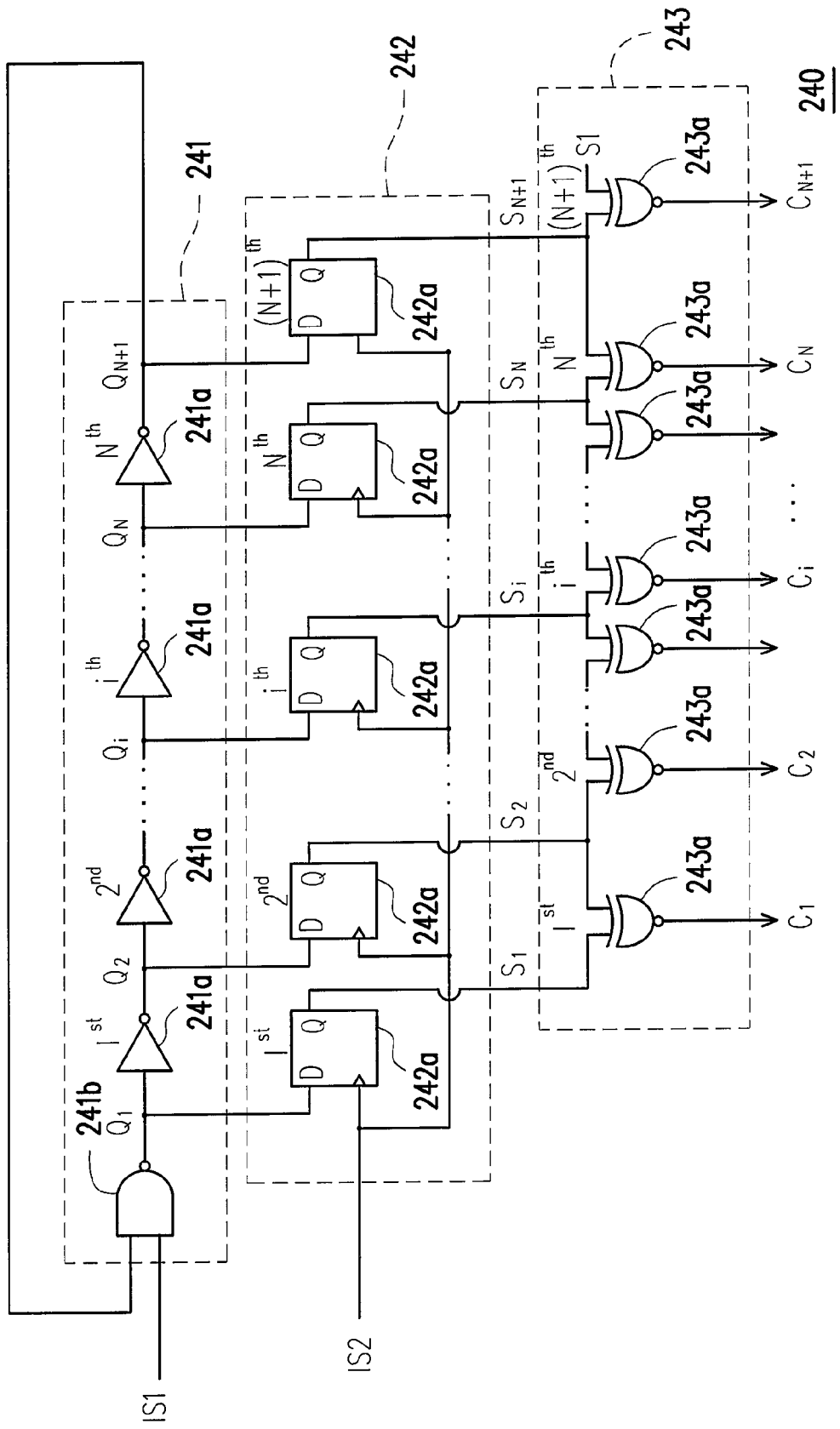
FIG. 6A is a circuit diagram of the time-to-digital converting module according to the embodiment of the present invention in FIG. 2.

FIG. 6A is a circuit diagram of the time-to-digital converting module 240 according to the embodiment of the present invention in FIG. 2. Referring to FIG. 6A, the time-to-digital converting module 240 includes a ring oscillating unit 241, a sampling unit 242 and a decoding unit 243. The ring oscillating unit 241 includes a plurality of inverters 241a and a NAND gate 241b. It is supposed that there are inverters 241a to the number of N. The $(i+1)^{th}$ inverter 241a has an input terminal coupled to an output terminal of the $i^{th}$ inverter 241a, wherein i is a positive integer and $1 \leq i \leq (N-1)$. The NAND gate 241b performs a logic processing on the first indication signal IS1 and a third signal $Q_{N+1}$ outputted from the $N^{th}$ inverter 241a, and generates a fourth signal $Q_1$ to the input terminal of the $1^{st}$ inverter 241a.

The sampling unit 242 is coupled to the ring oscillating unit 241. The sampling unit 242 samples the signals from the input terminals and the output terminals of the inverters 241a and generates the $1^{st}$ to $(N+1)^{th}$ sampled signals $S_1 \sim S_{N+1}$ according to the second indication signal IS2. The sampling unit 242 includes a plurality of flip flops 242a. It is supposed that there are flip flops 242a to the number of N+1. The $j^{th}$ flip flop 242a has a data terminal coupled to the input terminal of the $j^{th}$ inverter 241a, a control terminal receiving the second indication signal IS2, and an output terminal outputting the $j^{th}$ sampled signal $S_j$, wherein $1 \leq j \leq N$. The $(N+1)^{th}$ flip flop 242a has a data terminal coupled to the output terminal of the N$^{th}$ inverter 241, a control terminal receiving the second indication signal IS2, and an output terminal outputting the (N+1)$^{th}$ sampled signal S$_{N+1}$.

Figure 6B:
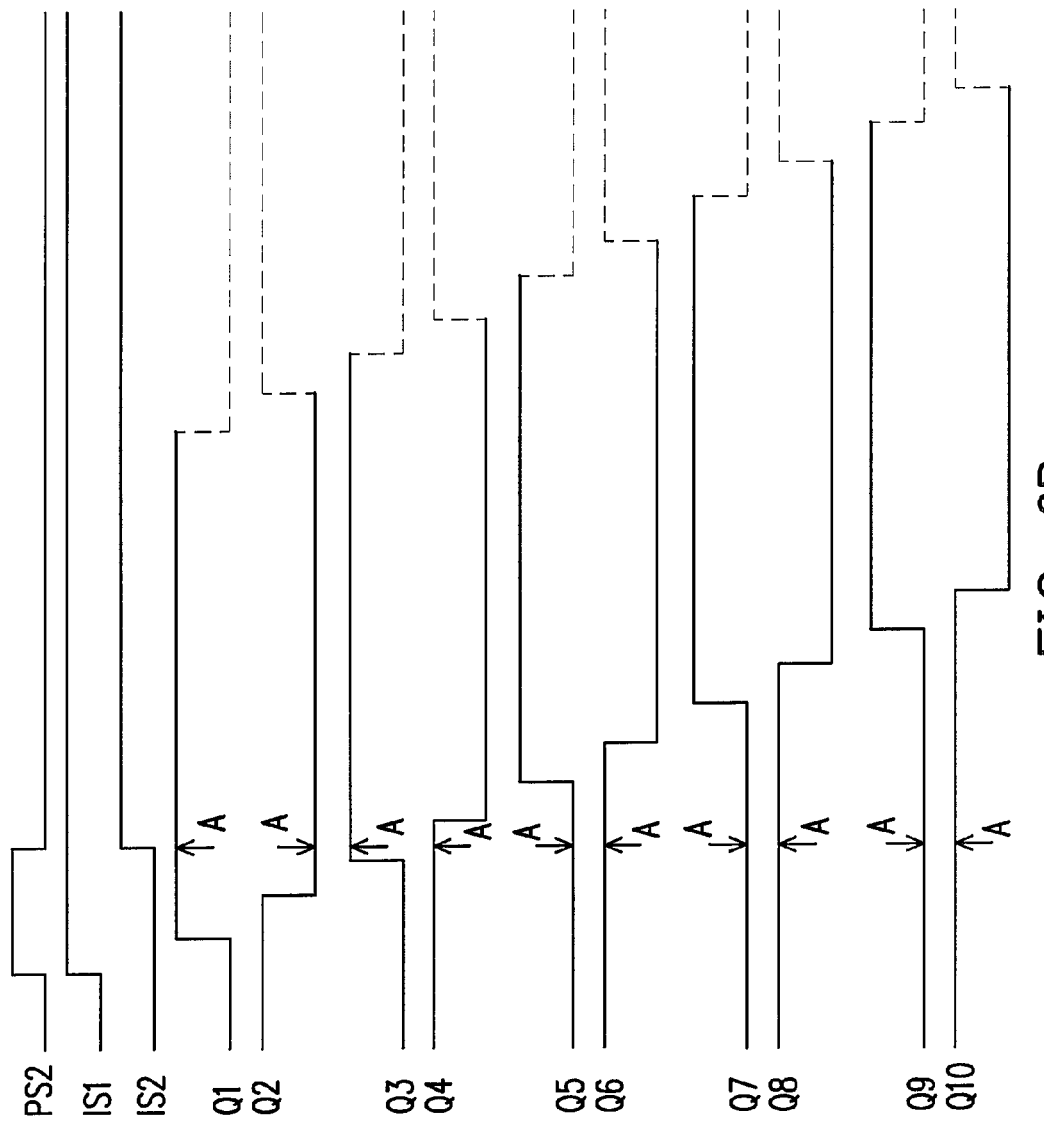
FIG. 6B is a timing diagram of the time-to-digital converting module according to the embodiment of the present invention in FIG. 6A.

FIG. 6B is a timing diagram of the sampling unit 242 according to the embodiment of the present invention. Referring to FIG. 6A and FIG. 6B, it is assumed that the delay time of each inverter 241a is T3 seconds, saying 20 picoseconds. The first indication signal IS1 and the second indication signal IS2 can be seen as a start signal and a stop signal respectively. When the first indication signal IS1 initially is in logic low level ("0"), the input terminal signal Q$_1$ of the 1$^{st}$ inverter 241a is in logic high level ("1"), and the input terminal signal Q$_2$ of the 2$^{nd}$ inverter 241a is in logic low level ("0"), and so on. When the first indication signal IS1 is in logic high level ("1"), the inverters 241a start to change their logic states periodically, that is to say, the input terminal signal Q$_1$ of the 1$^{st}$ inverter 241a becomes logic low level ("0"), the input terminal Q$_2$ of the 2$^{nd}$ inverter 241a becomes logic high level ("1"), and so on. When the rising edge of the second indication signal IS2 triggers the flip flops 242a, the terminal signals Q$_1$~Q$_{N+1}$ of the inverters 241a are fetched by the sampling unit 242. Among these terminals of the inverters 241a, two successive terminals of them are in same logic level, e.g. Q3 and Q4 in FIG. 6B, because there is not enough time for the 3$^{rd}$ inverters 241a to change its logic state.

Referring to FIG. 6A, the sampling unit 242 samples the output signals of the ring oscillating unit 241 and generates the 1$^{st}$ to (N+1)$^{th}$ sampled signals S$_1$~S$_{N+1}$ according to the second indication signal IS2. In the normal case, the input terminal and the output terminal of one inverter 241a have different logic levels. When the input terminal and the output terminal of one inverter 241a have the same logic level, it indicates that the inverter 241a is on the process of changing its logic state at the sampling time instant. When the second indication signal IS2 rises to logic high level ("1"), as arrow points A shown in FIG. 6B, the sampled signal S$_1$ through S$_{N+1}$ are in logic levels "1", "0", "1", "1", "0", "1", "0", "1", "0", "1" and so forth respectively. The decoding unit 243 analyzes the 1$^{st}$ to (N+1)$^{th}$ sampled signals S$_1$~S$_{N+1}$ to output the digital signal C$_k$, which expresses the pulse width of the second pulse signal PS2 in binary or other digital forms, by determining two neighboring signals with the same logic level, namely the k$^{th}$ sampled signal S$_k$ and the (k+1)$^{th}$ sampled signal S$_{k+1}$, wherein k is a positive integer and 1≦k≦N, or the (N+1)$^{th}$ sampled signal S$_{N+1}$ and the 1$^{st}$ sampled signal S$_1$.

Referring to FIG. 6A, a plurality of XNOR gates 243a are used to implement the decoding unit 243, wherein there are N+1 XNOR gates 243a. The k$^{th}$ sampled signal S$_k$ and the (k+1)$^{th}$ sampled signal S$_{k+1}$ are performed a logic processing through the k$^{th}$ XNOR gate 243a. The (N+1)$^{th}$ sampled signal S$_{N+1}$ is also performed the logic processing with the 1$^{st}$ sampled signal S$_1$ through the (N+1)$^{th}$ XNOR gate 243a. The k$^{th}$ XNOR gate 243a of the decoding unit 243 outputting a logic high level ("1") signal indicates the input and output terminals of the k$^{th}$ inverter 241a have the same logic level. The following gives an example for describing how to obtain the jitter value Dout of the signal-under-test TS.

For example, the k$^{th}$ inverter 241a of the ring oscillating unit 241 is detected that the input terminal and output terminal of the k$^{th}$ inverter 241a have the same logic level at the rising edge of the second indication signal IS2 for the first conversion. The k$^{th}$ inverter 241a is detected for the second conversion, if the signal-under-test TS has no Jitter. When the k$^{th}$ inverter 241a is detected, the decoding unit 243 outputs a digital signal "k", e.g. the decoding unit 243 outputs "0101" in binary expression when the 5$^{th}$ inverter 241a is detected. The difference of the digital signals between "k" and "k+1" stands for the resolution of the time-to-digital converting module 240. The decoding unit 243 can also calculate the timing difference between two outputted digital signal, such as C$_5$ (0101) and C$_6$ (0110), as the jitter value Dout. The timing difference, for example, is the delay time between the 5$^{th}$ inverter 241a and the 6$^{th}$ inverter 241a.

In the embodiment, the first pulse signals PS1, corresponding to the period of the signal-under-test TS, is retrieved by the signal retrieving module 210, amplified by the signal amplifying module 220, detected by the edge detecting module 230, and finally digitalized by the time-to-digital converting module 240 to output the digital signal corresponding to the period of the signal-under-test TS. After one conversion, the device for jitter measurement 200 is reset by the reset signals RESET and RST shown in FIG. 3A and FIG. 5 to start a new conversion.

Figure 7A:
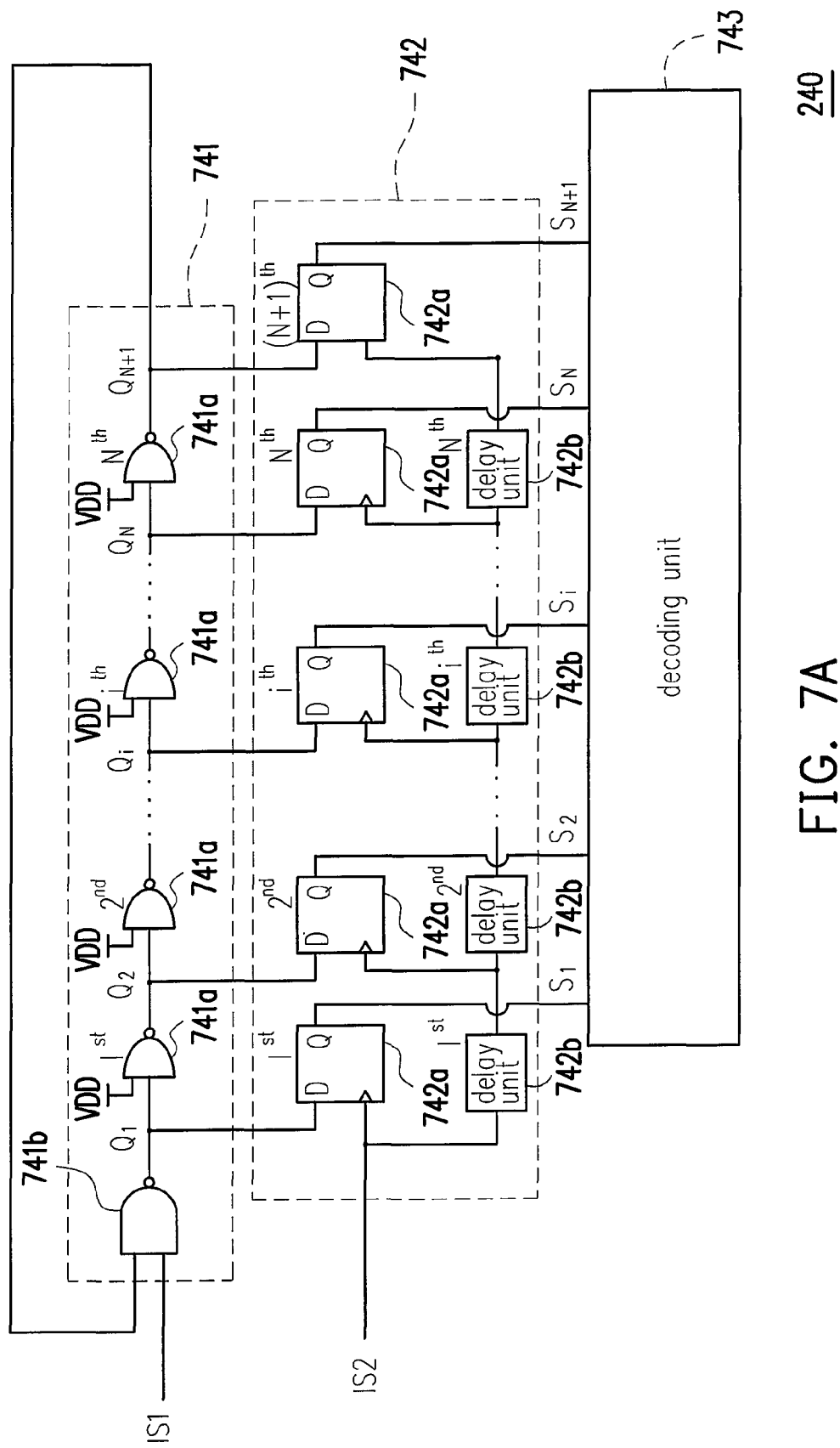
FIG. 7A is a circuit diagram of the time-to-digital converting module according to another embodiment of the present invention in FIG. 2.

As the above-mentioned description, the delay time of the inverter 241a defines the resolution for measuring jitter. Amplifying the pulse width of the first pulse signal PS1 can equivalently enhance the resolution for measuring the jitter value. In order to make people skilled in the art to put the embodiments into practice easily, there is another embodiment described below. FIG. 7A is a circuit diagram of the time-to-digital converting module 240 according to another embodiment of the present invention in FIG. 2. Referring to FIG. 7A, the time-to-digital converting module 240 includes a ring oscillating unit 741, a sampling unit 742 and a decoding unit 743. Referring to FIG. 6A and FIG. 7A, a plurality of NAND gates 741a in the ring oscillating unit 741 are used to replace the inverters 241a in FIG. 6A, and a plurality of delay units 742b are added in the sampling unit 742. There are N delay units 742b and the j$^{th}$ delay unit 742b is coupled between the control terminal of the j$^{th}$ flip flop 242a and the control terminal of the (j+1)$^{th}$ flip flop, where 1≦j≦N.

Figure 7B:
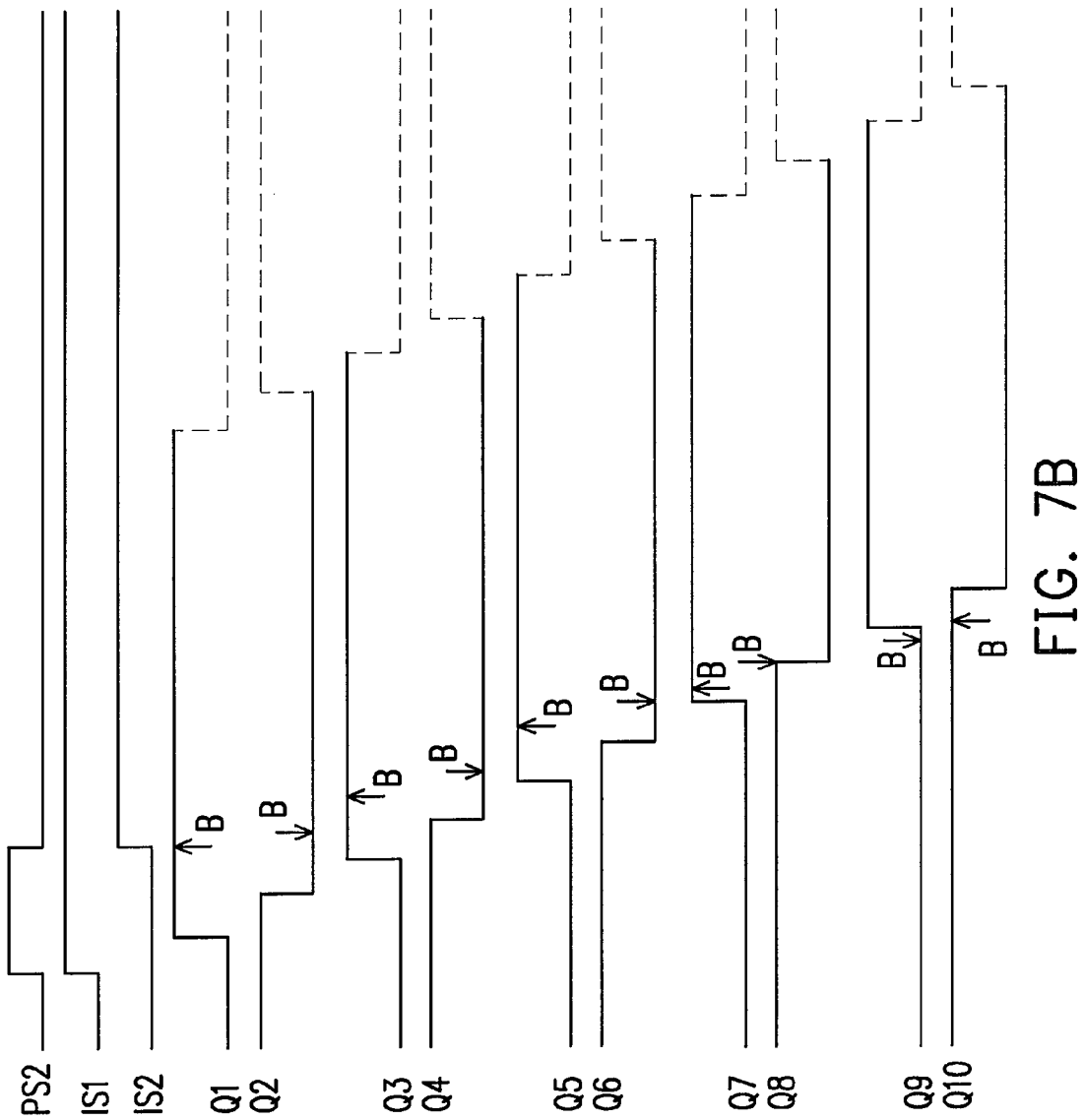
FIG. 7B is a timing diagram of the time-to-digital converting module according to the embodiment of the present invention in FIG. 7A.

Referring to FIG. 7A, it is assumed that the delay time of each NAND gate 741a is T5 seconds, and the delay time of each delay unit 742b is T6 seconds, which is smaller than the delay time of the NAND gate 741a, e.g. T5 is 30 picoseconds and T6 is 20 picoseconds. Hence, the rising edge of the second indication signal IS2 transmitted to the control terminal of the 2$^{nd}$ flip flop 742a lags behind that transmitted to the control terminal of the 1$^{st}$ flip flop 742a by T6 seconds, and so forth. As arrow points B shown in FIG. 7B, the sampled signals S$_1$ through S$_{N+1}$ are in logic levels "1", "0", "1", "0", "1", "0", "1", "1", "0", "1" and so forth respectively when the flip flops 742a are sequentially triggered by the rising edge of the second indication signal IS2. The digital signals are "3" and "7" in the decimal representation shown in FIG. 6B and FIG. 7B, respectively for the same signal-under-test TS. The comparison indicates that the resolution is improved as a result of the increased digital signal. The resolution for measuring the jitter value is the time difference between the delay time T5 of NAND gate 741a and the delay time T6 of the delay unit 742b, e.g. 10 picoseconds. In the embodiment, the decoding unit 743 analyzes the 1$^{st}$ to (N+1)$^{th}$ sampled signals S$_1$~S$_{N+1}$ to convert the pulse width of the second pulse signal PS2 to the digital signal. The decoding unit 743 also collects a plurality of digital signals for every conversion and calculates a root mean square value of the digital signals as the jitter value Dout.

Figure 8:
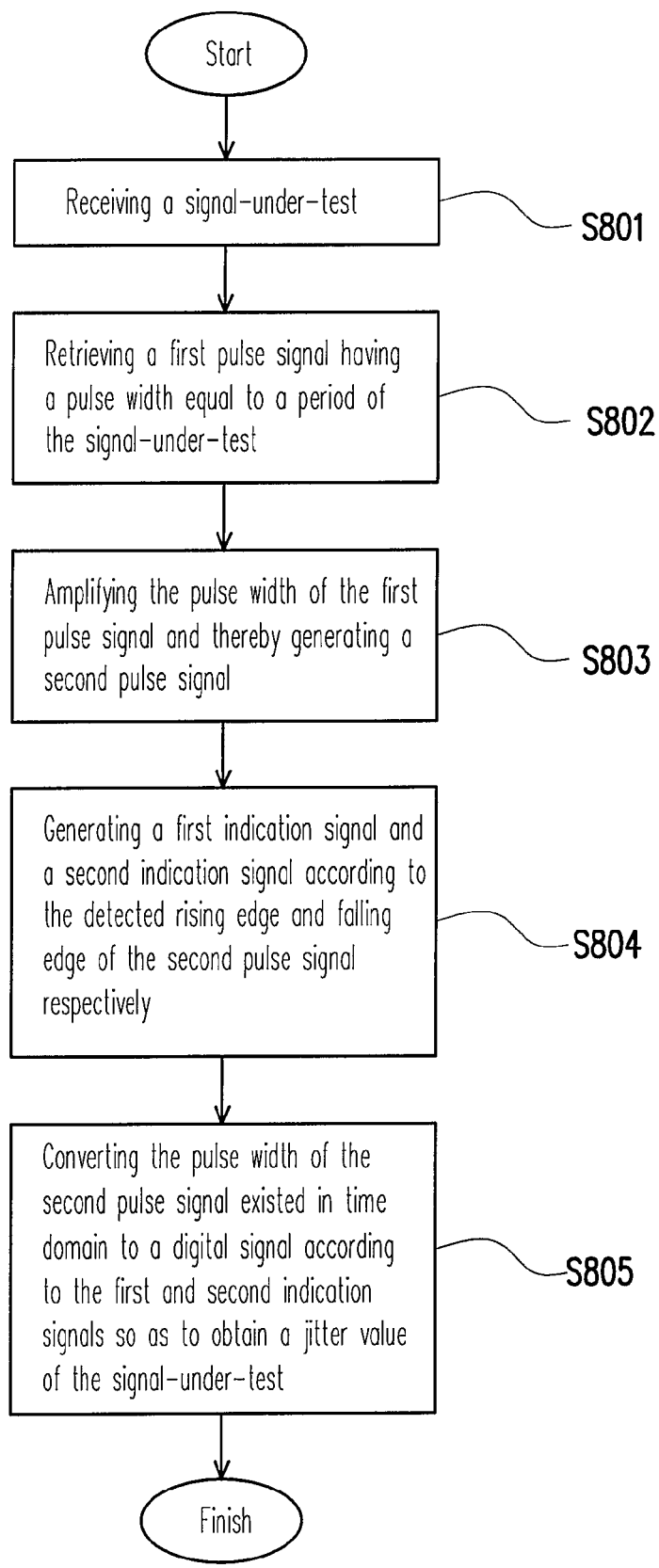
FIG. 8 is a flow chart of a method for jitter measurement according to an embodiment of the present invention.

According to the embodiments described above, the steps of the following method could be generalized. FIG. 8 is a flow chart of a method for jitter measurement according to an embodiment of the present invention. Referring to FIG. 2 and FIG. 8, a signal-under-test TS is received in step S801 and a first pulse signal having a pulse width equal to a period of the signal-under-test TS is retrieved from the signal-under-test TS in step S802. In step S803, the pulse width of the first pulse signal PS1 is amplified to equivalently improve the resolution and thereby a second pulse signal PS2 is generated. In step S804, a rising edge and a falling edge of the second pulse signal PS2 are detected, and then a first indication signal IS1 and a second indication signal IS2 are generated according to the detected rising and falling edges respectively. In step S805, the pulsed width of the second pulse signal PS2 existed in time domain is characterized to a digital signal according to the first indication signal IS1 and the second indication signal IS2 so as to obtain the jitter value Dout of the signal-under-test TS.

In summary, the said embodiments utilizes the signal amplifying module to amplify the pulse width of the first pulse signal by adjusting the amounts of charging current and the discharging current of the charge pump so as to equivalently improve the resolution of the time-to-digital converting module and provide multi-resolution function. Hence, the jitter values of the signals-under-test can be quantified by multiple resolutions. The first indication signal and the second indication signal are obtained by detecting the rising edge and the falling edge of the second pulse signal. The ring oscillating unit of the time-to-digital converting module starts to oscillate under the control of the first indication signal, and the sampling unit of the time-to-digital converting module samples the signals from the input terminals and the output terminals of the inverters, which are connected in series as a ring, in the ring oscillating unit, according to the second indication signal. The time-to-digital converting module is based on a ring oscillating unit and can be used to quantize fine time interval despite the period of signal-under-test. As a result, the said embodiments can measure jitter of a signal independent to its frequency. Combining the delayed sampling and pulse amplifying techniques, better resolution can be achieved. The decoding unit of the time-to-digital converting module can converter the pulse width of the second pulse signal to the digital signal so as to obtain the jitter value of the signal-under-test.

As known, external testing equipments, providing high quality testing for high speed signals, are very expensive and can not be massly produced. Besides, for testing purpose, buffers, multiplexers, control units, and some additional circuits are necessary to propagate the signals-under-test to the I/O pins of the chip by employing conventional external testing method. The said embodiments of the present invention are built-in self testing for jitter measurement so that the additional testing cost can be reduced and the complexity of circuit design can be alleviated. In addition, the said embodiments of the present invention do not need a reference signal to compare with the signal-under-test so that the jitter value of the signal-under-test can be correctly measured without the disturbance caused by the jitter of the reference signal.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A device for jitter measurement, comprising:
    a signal retrieving module, receiving a signal-under-test, and outputting a first pulse signal having a pulse width equal to a period of the signal-under-test;
    a signal amplifying module, amplifying the pulse width of the first pulse signal, and thereby generating a second pulse signal;
    an edge detecting module, generating a first indication signal and a second indication signal according to the detected rising edge and the detected falling edge of the second pulse signal respectively; and
    a time-to-digital converting module, converting the pulse width of the second pulse signal existed in time domain to a digital signal according to the first indication signal and the second indication signal.

2. The device for jitter measurement as claimed in claim 1, wherein the signal retrieving module comprises:
    a first edge detector, having a data terminal coupled to a first voltage, a control terminal receiving the signal-under-test, a reset terminal receiving a first reset signal, and an output terminal generating a first signal;
    a second edge detector, having a data terminal coupled to the first voltage, a control terminal receiving the signal-under-test, a reset terminal coupled to the output terminal of the first edge detector, and an output terminal generating a second signal; and
    a first logic gate, performing a first logic processing on the first signal and the second signal, and thereby generating the first pulse signal.

3. The device for jitter measurement as claimed in claim 2, wherein the signal retrieving module further comprises:
    a first inverter, having an input terminal and an output terminal respectively coupled to the output terminal of the first edge detector and the reset terminal of the second edge detector.

4. The device for jitter measurement as claimed in claim 1, wherein the signal amplifying module comprises:
    a first capacitor, having a first terminal generating the second pulse signal, and a second terminal coupled to a first voltage; and
    a charge pump, coupled between the signal retrieving module and the first terminal of the first capacitor and used for charging or discharging the first capacitor according to the first pulse signal, wherein the pulse width of the first pulse signal is amplified by controlling the amounts of charging current and discharging current.

5. The device for jitter measurement as claimed in claim 4, wherein the signal amplifying module further comprises:
    a buffer unit, having an input terminal coupled to the first terminal of the first capacitor for enhancing signal transmission intensity; and
    a second inverter, having an input terminal coupled to an output terminal of the buffer unit, and an output terminal outputting the second pulse signal.

6. The device for jitter measurement as claimed in claim 5, wherein the buffer unit comprises:
    a third inverter, having an input terminal coupled to the first terminal of the first capacitor, and an output terminal; and
    a fourth inverter, having an input terminal coupled to the output terminal of the third inverter, and an output terminal served as the output terminal of the buffer unit.

7. The device for jitter measurement as claimed in claim 4, wherein the charge pump comprises:
    a first switch, having a first terminal coupled to a second voltage, a second terminal, and a control terminal receiving a pull-up signal;
    a first current source, having a first terminal coupled to the second terminal of the first switch, and a second terminal coupled to the first terminal of the first capacitor;

a second current source, having a first terminal coupled to the second terminal of the first current source, and a second terminal; and a second switch, having a first terminal coupled to the second terminal of the current source, a second terminal coupled to the first voltage and a control terminal receiving a pull-down signal, wherein the pull-up signal and the pull-down signal are generated according to the first pulse signal.

8. The device for jitter measurement as claimed in claim 7, wherein the signal amplifying module further comprises:

a second logic gate, performing a second logic processing on the first pulse signal and a signal of the first terminal of the first capacitor, and thereby generating the pull-up signal, wherein the pull-down signal is the first pulse signal.

9. The device for jitter measurement as claimed in claim 1, wherein the edge detecting module comprises:

a third edge detector, having a data terminal coupled to a first voltage, a control terminal receiving the second pulse signal, a reset terminal receiving a second reset signal, and an output terminal generating the first indication signal; and a fourth edge detector, having a data terminal coupled to the first voltage, a control terminal receiving an inverted signal of the second pulse signal, a reset terminal receiving the second reset signal, and an output terminal generating the second indication signal.

10. The device for jitter measurement as claimed in claim 9, wherein the edge detecting module further comprises:

a fifth inverter, having an input terminal receiving the second pulse signal, and an output terminal coupled to the control terminal of the fourth edge detector.

11. The device for jitter measurement as claimed in claim 1, wherein the time-to-digital converting module comprises:

a ring oscillating unit, comprising:

a plurality of inverters, the $(i+1)^{th}$ inverter having an input terminal coupled to an output terminal of the $i^{th}$ inverter, wherein i is a positive integer, $1 \leq i \leq (N-1)$ and N is the number of the inverters; and a third logic gate, coupled between the output terminal of the $N^{th}$ inverter and the input terminal of the $1^{st}$ inverter for performing a third logic processing on the first indication signal and a third signal outputted from the $N^{th}$ inverter, and thereby generating a fourth signal to the input terminal of the $1^{st}$ inverter;

a sampling unit, coupled to the ring oscillating unit and sampling the signals from the input terminals and the output terminals of the inverters to generate the $1^{st}$ to $(N+1)^{th}$ sampled signals according to the second indication signal; and a decoding unit, decoding the $1^{st}$ to $(N+1)^{th}$ sampled signals and thereby obtaining a jitter value of the signal-under-test.

12. The device for jitter measurement as claimed in claim 11, wherein the sampling unit comprises:

a plurality of flip flops, the $j^{th}$ flip flop having an data terminal coupled to the input terminal of the $j^{th}$ inverter, a control terminal receiving the second indication signal, and an output terminal outputting the $j^{th}$ sampled signal, and the $(N+1)^{th}$ flip flop having an data terminal coupled to the output terminal of the $N^{th}$ inverter, a control terminal receiving the second indication signal, and an output terminal outputting the $(N+1)^{th}$ sampled signal, wherein j is a positive integer, $1 \leq j \leq N$.

13. The device for jitter measurement as claimed in claim 12, wherein the sampling unit further comprises:

a plurality of delay units, the $j^{th}$ delay unit coupled between the control terminal of the $j^{th}$ flip flop and the control terminal of the $(j+1)^{th}$ flip flop for delaying the second indication signal.

14. The device for jitter measurement as claimed in claim 11, wherein the decoding unit analyzes the $1^{st}$ to $(N+1)^{th}$ sampled signals to find the $k^{th}$ inverter, which the $k^{th}$ sampled signal and the $(k+1)^{th}$ sampled signal are in same logic level, for converting the pulse width of the second pulse signal to the digital signal, and the decoding unit calculates the timing difference between the digital signal in one conversion and the digital signal in another conversion as the jitter value.

15. The device for jitter measurement as claimed in claim 11, wherein the decoding unit analyzes the $1^{st}$ to $(N+1)^{th}$ sampled signals to convert the pulse width of the second pulse signal to the digital signal and records the digital signal in every conversion for calculating a root mean square as the jitter value.

16. A method for jitter measurement, comprising:

receiving a signal-under-test;

retrieving a first pulse signal having a pulse width equal to a period of the signal-under-test by using a signal retrieving module;

amplifying the pulse width of the first pulse signal and thereby generating a second pulse signal by using a signal amplifying module;

detecting a rising edge and a falling edge of the second pulse signal and generating a first indication signal and a second indication signal according to the detected rising edge and the detected falling edge of the second pulse signal respectively by using an edge detecting module; and converting the second pulse signal existed in time domain to a digital signal according to the first indication signal and the second indication signal for obtaining a jitter value of the signal-under-test by using a time-to-digital converting module.

17. The method for jitter measurement as claimed in claim 16, wherein the step of retrieving the first pulse signal having the pulse width equal to the period of the signal-under-test comprises:

detecting a first rising edge of the signal-under-test and generating a first signal, wherein the first signal rises to logic high level when the first rising edge is detected;

detecting a second rising edge of the signal-under-test and generating a second signal, wherein the second signal rises to logic high level when the second rising edge is detected; and performing a XOR logic processing on the first signal and the second signal and thereby generating the first pulse signal.

18. The method for jitter measurement as claimed in claim 16, wherein the step of amplifying the pulse width of the first pulse signal and thereby generating the second pulse signal comprises:

utilizing the first pulse signal to control a charge pump to charge or discharge an electricity storage component;

controlling the amounts of charging current and discharging current to amplify the pulse width of the first pulse signal; and generating the second pulse signal according to a voltage across the electricity storage component.

19. The method for jitter measurement as claimed in claim 16, wherein the step of generating the first indication signal and the second indication signal according to the detected rising edge and the detected falling edge of the second pulse signal respectively comprises:

generating the first indication signal rising to a logic high level when the rising edge of the second pulse signal is detected; and generating the second indication signal rising to logic high level when the falling edge of the second pulse signal is detected.

20. The method for jitter measurement as claimed in claim 16, wherein the step of converting the second pulse signal existed in time domain to the digital signal according to the first indication signal and the second indication signal comprises:

controlling a ring oscillating unit composed of a plurality of inverters connected in series as a ring to operate according to the first indication signal;

sampling the input terminals and the output terminals of the inverters to generate a plurality of sampled signals according to the second indication signal;

analyzing the sampled signals to find the $k^{th}$ inverter, which the $k^{th}$ sampled signal and the $(k+1)^{th}$ sampled signal are in same logic level, for converting the pulse width of the second pulse signal to the digital signal, wherein k is a positive integer, $1 \leq k \leq N$, and N is the number of the inverters; and calculating the timing different between the digital signal in one conversion and the digital signal in another conversion as the jitter value of the signal-under-test.

21. The method for jitter measurement as claimed in claim 16, wherein the step of converting the second pulse signal existed in time domain to the digital signal according to the first indication signal and the second indication signal comprises:

controlling a ring oscillating unit composed of a plurality of inverters connected in series as a ring to operate according to the first indication signal;

sampling the input terminals and the output terminals of the inverters to generate a plurality of sampled signals according to the second indication signal;

analyzing the sampled signals to convert the pulse width of the second pulse signal to the digital signal; and recording the digital signal in every conversion for calculating a root mean square value as the jitter value of the signal-under-test.

* * * * *